United States Patent
Song et al.

(10) Patent No.: US 9,594,864 B2
(45) Date of Patent: Mar. 14, 2017

(54) METHOD FOR ASYMMETRICAL GEOMETRICAL SCALING

(71) Applicant: QUALCOMM Incorporated, San Diego, CA (US)

(72) Inventors: Stanley Seungchul Song, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 50 days.

(21) Appl. No.: 14/693,690

(22) Filed: Apr. 22, 2015

(65) Prior Publication Data

US 2016/0314235 A1    Oct. 27, 2016

(51) Int. Cl.
*G06F 17/50*   (2006.01)
*G03F 7/20*    (2006.01)
*H01L 27/02*   (2006.01)

(52) U.S. Cl.
CPC ...... *G06F 17/5072* (2013.01); *G03F 7/70433* (2013.01); *G06F 17/5081* (2013.01); *H01L 27/0207* (2013.01)

(58) Field of Classification Search
CPC ............. G06F 17/5072; G06F 17/5081; H01L 27/0207; G03F 7/70433
See application file for complete search history.

(56) References Cited

U.S. PATENT DOCUMENTS

| | | | |
|---|---|---|---|
| 5,477,467 A | 12/1995 | Rugg | |
| 5,936,868 A | 8/1999 | Hall | |
| 6,756,242 B1 | 6/2004 | Regan | |
| 6,877,144 B1* | 4/2005 | Rittman | G06F 17/5068 716/52 |
| 7,055,114 B2 | 5/2006 | Kever et al. | |
| 7,783,995 B2 | 8/2010 | Joshi | |
| 8,423,941 B2 | 4/2013 | Heng et al. | |
| 2005/0081167 A1* | 4/2005 | Kever | G06F 17/5081 716/52 |
| 2005/0125748 A1 | 6/2005 | Gray et al. | |
| 2006/0123367 A1* | 6/2006 | Sakurabayashi | G06F 17/5077 257/774 |
| 2014/0380259 A1 | 12/2014 | Tuan | |

OTHER PUBLICATIONS

International Search Report and Written Opinion—PCT/US2016/024765—ISA/EPO—Jun. 27, 2016.

* cited by examiner

Primary Examiner — Nha Nguyen
(74) Attorney, Agent, or Firm — Muncy, Geissler, Olds & Lowe, P.C.

(57) ABSTRACT

A circuit layout data has a start value of a first-axis pitch and a start value of a second-axis pitch, the second axis pitch being transverse to the first-axis pitch. The start value of the first axis pitch and the start value of the second axis pitch correspond to single pattern lithography. The first axis pitch is scaled to a first axis single pattern-to-double pattern pitch transition threshold, and then additionally scaled until reaching a first axis double pattern resolution limit. Scaling the first axis pitch to the first axis double pattern resolution limit utilizes routing spaces parallel to the second axis pitch.

31 Claims, 6 Drawing Sheets

METHOD FOR ASYMMETRICAL GEOMETRICAL SCALING

FIELD OF DISCLOSURE

The present application is generally related to layout and fabrication of semiconductor integrated circuits (ICs).

BACKGROUND

In conventional semiconductor circuit layout, dimensions and spacing of features can be specified along Cartesian, or X-Y axes. Reducing, or scaling down (hereinafter "scaling") the dimensions and spacing has long been an objective, for purposes including compressing more functionality into a smaller volume, and increasing operating speed. Conventional geometric techniques for scaling semiconductor circuits can apply a generally symmetric scaling, i.e., the same scaling factor along the X and the Y axes. This can provide an area reduction of approximately the square of the scaling factor. However, costs of such scaling both X and Y can be substantial. For example as we migrate to multi patterning territory of design rules.

SUMMARY

This Summary identifies features and aspects of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

Example methods for scaling an integrated circuit, and example operations according to various aspects, are disclosed. In one aspect, operations may include receiving a circuit layout data, wherein the circuit layout data can include a present value of a first axis pitch and a present value of a second axis pitch, wherein the first axis pitch is parallel to a first axis, the second axis pitch is parallel to a second axis, and the first axis is traverse to the second axis. In an aspect, operations may include, upon a first axis margin being larger than a second axis margin, scaling the first axis pitch, wherein scaling the first axis pitch scales the first axis pitch toward a first axis resolution limit. In a related aspect, the first axis margin can be a difference between the present value of the first axis pitch and a first axis resolution limit, and the first axis resolution limit may be a given resolution limit of a given first axis lithography. In an aspect, the second axis margin can be a difference between the present value of the second axis pitch and a second axis resolution limit, and the second axis resolution limit can be a given resolution limit of a given second axis lithography.

In an aspect, a computer product may have a computer readable medium comprising instructions that, when read and executed by a processor, cause the processor to receive a circuit layout data, wherein the circuit layout data can include a present value of a first axis pitch, and a present value of a second axis pitch, wherein the first axis pitch can be parallel to a first axis, the second axis pitch can be parallel to a second axis, and the first axis is traverse to the second axis. In an aspect, the instructions can also include instructions that, when read and executed by the processor, can cause the processor, upon a first axis margin being larger than a second axis margin, to scale the first axis pitch, wherein to scale the first axis pitch can include to scale the first axis pitch toward a first axis resolution limit. In an aspect, the first axis margin can be a difference between the present value of the first axis pitch and a first axis resolution limit, and the first axis resolution limit can be a given resolution limit, along the first axis, of a given first axis lithography. In a related aspect, the second axis margin can be a difference between the present value of the second axis pitch and a second axis resolution limit, and the second axis resolution limit can be a given resolution limit, along the second axis, of a given second axis lithography.

In one disclosed method for scaling an integrated circuit, example operations can include receiving a circuit layout data, wherein the circuit layout data may include a present value of a first axis pitch, and a present value of a second axis pitch, wherein the first axis pitch can be parallel to a first axis, the second axis pitch can be parallel to a second axis, and the first axis can be traverse to the second axis. In an aspect, example operations can also include receiving a first axis pitch threshold and a second axis pitch threshold, wherein the first axis pitch threshold represents a lower limit of the first axis pitch that, if crossed, may require migrating to a higher resolution first axis lithography, and the second axis pitch threshold represents a lower limit of the second axis pitch that, if crossed, may require migrating to a higher resolution second axis lithography. In an aspect, example operations can also include, upon a difference between the present value of the first axis pitch and the first axis pitch threshold being larger than a difference between the present value of the second axis pitch and the second axis pitch threshold, scaling the first axis pitch, wherein scaling the first axis pitch may include scaling the first axis pitch toward the first axis pitch threshold.

In an aspect, a computer product may have a computer readable medium comprising instructions that, when read and executed by a processor, cause the processor to receive a circuit layout data, wherein the circuit layout data can includes a present value of a first axis pitch, and a present value of a second axis pitch, wherein the first axis pitch can be parallel to a first axis, the second axis pitch can be parallel to a second axis, and the first axis may be traverse to the second axis. In an aspect, the instructions can also include instructions that, when read and executed by the processor, can cause the processor to receive a first axis pitch threshold and a second axis pitch threshold, wherein the first axis pitch threshold can represent a lower limit of the first axis pitch that, if crossed, requires migrating to a higher resolution first axis lithography, and the second axis pitch threshold can represent a lower limit of the second axis pitch that, if crossed, requires migrating to a higher resolution second axis lithography. In an aspect, the instructions can also include instructions that, when read and executed by the processor, can cause the processor, upon a difference between the present value of the first axis pitch and the first axis pitch threshold being larger than a difference between the present value of the second axis pitch and the second axis pitch threshold, to scale the first axis pitch, wherein scaling the first axis pitch can include scaling the first axis pitch toward the first axis pitch threshold.

BRIEF DESCRIPTION OF THE DRAWINGS

The accompanying drawings are presented to aid in the description of aspects of the invention and are provided solely for illustration not limitation thereof.

DETAILED DESCRIPTION

Aspects are disclosed in the following description and related drawings. Various alterations that do not depart from the scope of the disclosed aspects may become apparent upon reading this disclosure. Additionally, in description of certain example applications, implementations and operations related to same, instances are identified, explicitly or implicitly from the described context, where known conventional techniques may be employed for certain components and acts. In such instances, detailed description of the employed conventional techniques may be omitted, to avoid obscuring concepts.

The terminology used herein is for the purpose of describing particular aspects only and is not intended to be limiting of any aspects or implementations thereof.

As used herein, the singular forms "a," "an," and "the" are intended to include the plural forms as well, unless the context clearly indicates otherwise. In addition, the terms "comprises," "comprising," "includes" and/or "including," as used herein, specify the presence of stated features, integers, steps, operations, elements, and/or components, but do not preclude the presence or addition of one or more other features, integers, steps, operations, elements, components, and/or groups thereof The word "exemplary" is used herein to mean "serving as an example, instance, or illustration." Any aspect or example configuration of same that described herein as "exemplary" is not necessarily to be construed as preferred or advantageous over other aspects or configurations. Likewise, discussion of a feature, advantage or mode of operation in relation to the term "aspects of the invention" does not imply that all aspects of the invention include the discussed feature, advantage or mode of operation.

Various illustrative logical blocks, modules, circuits, and algorithm steps according to aspects disclosed herein are described in terms of functionality. It will be understood that such logical blocks, modules, circuits, and algorithm steps may be implemented, interchangeably, as electronic hardware, computer software, or combinations of both. Whether such functionality is implemented as hardware or software, or combinations thereof, can be application-specific, as will be readily understood by persons or ordinary skill upon reading this disclosure.

Figure 1:
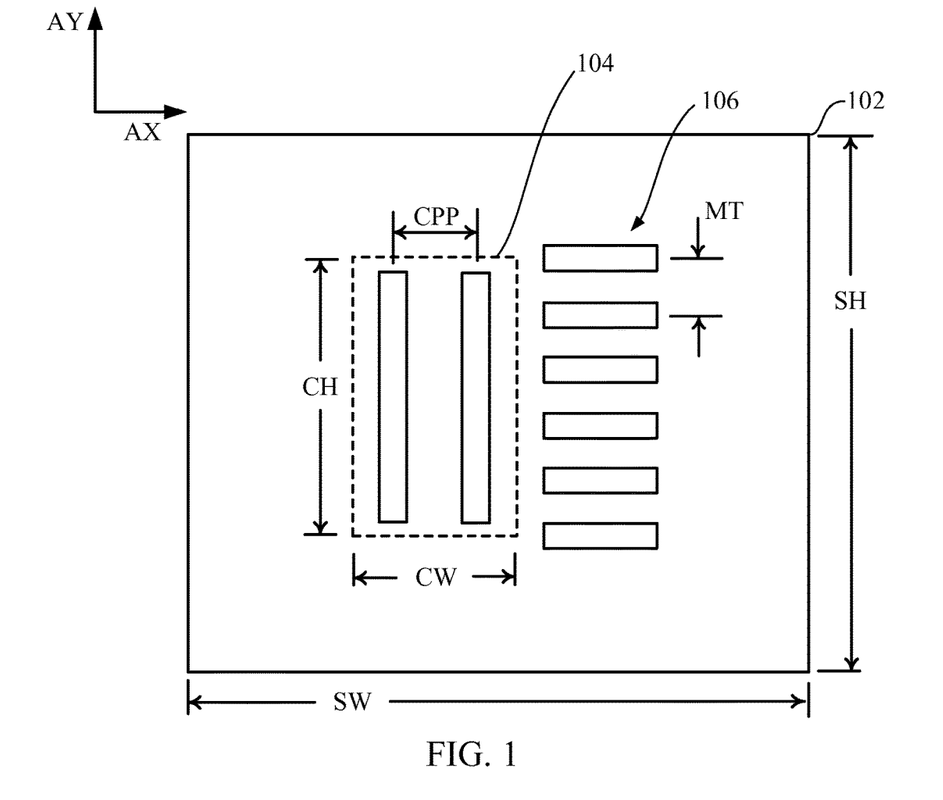
FIG. 1 is a height-width diagram of one generic standard cell, with exemplary two-dimension and pitch features.

FIG. 1 is a diagram of a standard cell 102, which can comprise one more logic cells, such as the logic cell 104, and a metallization 106. Description of spacing and orientations in the standard cell 102 will be in reference to a first axis, labeled AX and, transverse to the first axis, a second axis, labeled AY. The first axis and the second axis are shown in FIG. 1 as oriented horizontally and vertically, respectively, on the image plane. It will be understood that these orientations are only for convenience and impose no limitation with respect to any external reference. It will also be understood by persons of ordinary skill in the art that the logic cell 104 and the metallization 106 are high level representations, but such persons have knowledge of various kinds and ranges of details and, further, such details are not necessary for an understanding of concepts. Therefore, further description of such details is omitted.

Referring to FIG. 1, the logic cell 104 can comprise a plurality of poly elements (visible on FIG. 1 but not separately labeled) that can be spaced along the first axis according to a first axis pitch, e.g., a contacted poly pitch (CPP). The logic cell 102 can therefore have a logic cell width CW along the first axis, where CW can correspond to CPP multiplied by the number of poly elements, and can have a logic cell height CH along the second axis. The metallization 106 can comprise a plurality of metal traces (visible in FIG. 1 but not separately numbered), which can be aligned on first axis rails, in turn spaced along the second axis by a second axis pitch, such as the metallization pitch MT.

Continuing to refer to FIG. 1, the standard cell 102 can have a standard cell width, labeled SW, and a standard cell height, labeled SH. The standard cell width can be approximately the first axis pitch multiplied by a quantity of first axis grids. The standard cell height can be approximately the second axis pitch multiplied by a quantity of second axis rails.

Figure 2:
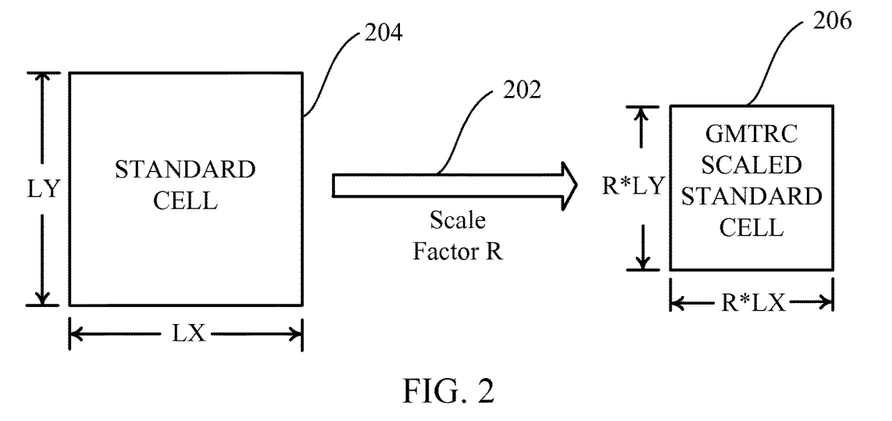
FIG. 2 is high-level diagram representing a conventional migration in scale.

FIG. 2 shows a conventional geometric scaling 202 of a standard cell area 204 having width LX and height LY to scaled standard cell area 206. It will be understood that "width" and "height" are arbitrarily assigned labels for the respective dimensions of the standard cell area 204 along the first axis and the second axis, respectively, and impose no limitation with respect to any external reference. The conventional geometric scaling 202 can comprise multiplying a first axis pitch and a second axis pitch by the same scaling factor, R. The conventional geometric scaling 202 is therefore symmetric. For example, assuming the width LX and height LY prior to scaling, the scaled standard cell area 206 can have a scaled width equal to R*LX and scaled height equal to R*LY. The resulting area of the scaled standard cell area 206 will therefore be R*LX times R*LY, which is R squared times the original area. To reduce the area by approximately one-half, R will be 0.7, i.e., approximately the square root of one-half. As an illustration, assuming the standard cell area 204 as being the FIG. 1 standard cell 102, the conventional geometric scaling 202 could multiply the contacted poly pitch and the metallization pitch MT by the square root of one-half and obtain a scaled standard cell area of approximately one-half the original standard cell area.

Figure 3:
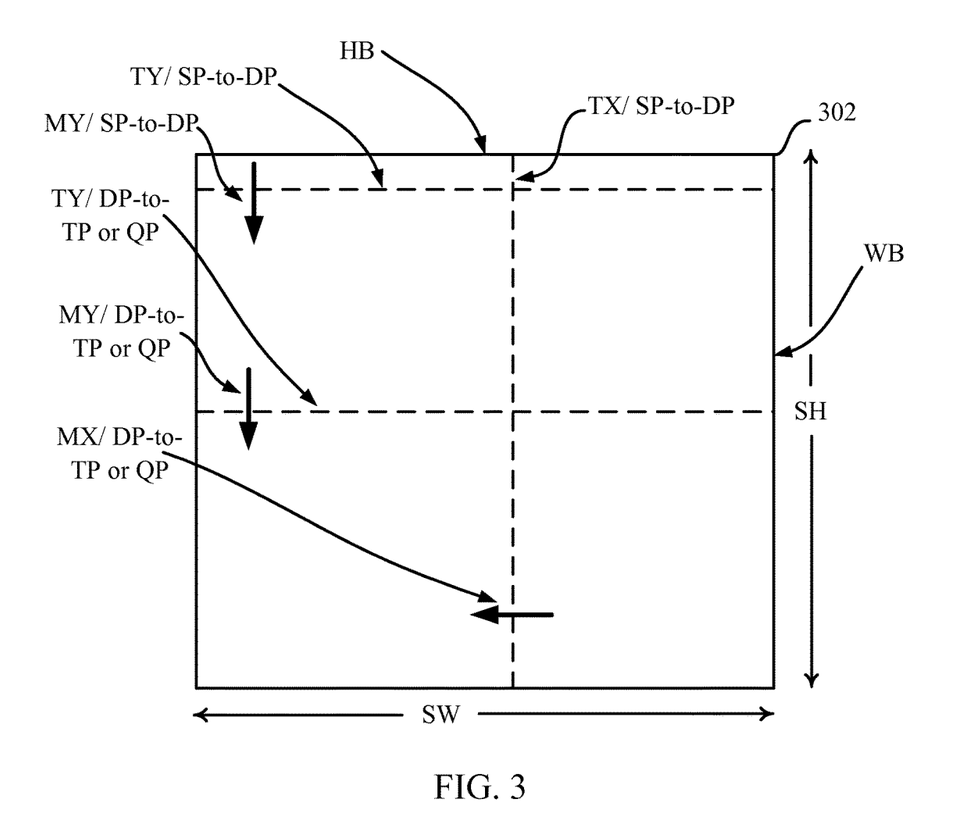
FIG. 3 is a diagram of a standard cell height-width scaling, showing examples of complexity inflection points at which height scaling and width scaling require single to double and higher patterning.

FIG. 3 is a diagram 300 representing a two-dimensional scaling, along the first axis and the second axis, versus complexity inflection points. The phrase "complexity inflection points" is an arbitrarily assigned label for threshold values of scaling that, if crossed, may require migration to a higher multiple pattern lithography. One example migration to a higher multiple pattern lithography can be from a single pattern lithography to a double pattern lithography. Another example migration to a higher multiple pattern lithography can be from the double pattern lithography to triple or quadruple pattern lithography. As one illustrative example, assume a scaling is started along, for example, the first axis and that the starting value of the first axis pitch is within the resolution limit of a first axis single pattern lithography. If the scaling is continued, it may hit the resolution limit of the first axis single pattern lithography. At that point, any further scaling along the first axis may require migrating to a first axis double pattern lithography. That point can be one example complexity inflection point. In a similar example, a scaling along the second axis may start within the resolution limit of the second axis single pattern lithography, and continue until it hits that resolution limit. That point can be another example complexity inflection point.

It will be understood that single pattern to double pattern migration, and double pattern to triple pattern or quadruple pattern migration are only examples, and are not intended to limit the scope of practices according to disclosed concepts and aspects thereof. For example, practices can include a migration directly from a single pattern lithography to a triple or quadruple pattern lithography.

It will also be understood that complexity inflection points are not necessarily coincident with absolute resolution limits of a given lithography. For example, a rule can be defined that dictates migration to a higher multiple pattern lithography at a scaling that has not yet reached the absolute, or estimated absolute resolution limit of the given lithography. As illustration, a migration rule (and hence a complexity inflection point) can be defined to require migration to a higher multiple pattern lithography when the scaling is at a given percentage above the absolute resolution limit. For example, without limitation, a migration rule can be defined to require migration from a single pattern lithography to a double pattern lithography when the scaling is at 115% of the absolute or estimated absolute resolution limit of the single pattern lithography.

Referring to FIG. 3, the outer perimeter 302 can be a starting perimeter, or starting boundary, of a standard cell area prior to scaling. The outer perimeter 302 will be alternatively referred to as a "pre-scaled standard cell area 302." The pre-scaled standard cell area 302 can be aligned with two mutually transverse axes, e.g., the first axis and second axis used in the description referring to FIG. 1, and labeled in like manner on FIG. 3 as "AX" and "AY," respectively as labeled on FIG. 1. Referring to FIG. 3, the pre-scaled standard cell area 302 is shown rectangular, having a starting upper or height boundary, labeled "HB," and a parallel, lower boundary (visible in FIG. 3 but not separately labeled) spaced under the starting height boundary by a "height." The pre-scaled standard cell area 302 is also shown with a leftmost vertical lateral boundary (visible in FIG. 3 but not separately labeled) and, opposite it, and spaced apart by a starting "width" boundary, which is a rightmost of two parallel vertical boundaries and which is labeled "WB." It will be understood that "height" and "width" are only labels, and have no meaning with respect to any external reference system.

For convenience, scaling along the second axis will be described as moving the height boundary downward from the position of the starting height boundary and leaving the lower boundary fixed. Similarly, scaling along the first axis will be described as moving the width boundary inward from the position of the starting width boundary and leaving the leftmost vertical boundary as fixed. It will be understood that this description of moving one boundary while leaving the other fixed is only an artifice. In actual practices according to disclosed concepts and aspects, all boundaries can be treated as movable. Persons of ordinary skill in the art, though, upon reading this disclosure, can readily adapt its concepts and aspects thereof to practices in which all boundaries of a standard cell are moved.

The pre-scaled standard cell area 302, as previously described, a width SW equal to a number of grids (not explicitly visible in FIG. 3) along the first axis, multiplied by a first axis pitch between the grids, e.g., the FIG. 1 CPP. The standard cell area 302 can have height SH equal to a number of rails (not explicitly visible in FIG. 3) along the second axis, multiplied by a second axis pitch between the rails, e.g., the FIG. 1 metallization pitch MT.

Referring to FIG. 3, there can be one or more first axis complexity inflection points. In an aspect, each of the one or more first axis complexity inflection points can be associated with a threshold that, when approached from right-to-left in FIG. 3, can require migration to a higher multiple pattern lithography along the first axis. FIG. 3 shows one first axis complexity inflection point as a first axis single pattern-to-double pattern threshold, labeled "TX/SP-to-DP." The first axis single pattern-to-double pattern threshold can be the point, in scaling along the first axis, at which further scaling necessitates (or is dictated by a rule as requiring) a migration from a first axis single pattern lithography to a first axis double pattern lithography. The migration from the first axis single pattern lithography to the first axis double pattern lithography, associated with first axis single pattern to double pattern threshold, is labeled in FIG. 3 as "MX/SP-to-DP."

Continuing to refer to FIG. 3, there can likewise be one or more second axis complexity inflection points. FIG. 3 shows two example second axis complexity inflection points. One is a second axis single pattern to double pattern threshold, labeled "TY/SP-to-DP," and the other is a second axis double pattern to triple or quadruple pattern threshold, labeled "TY/DP-to-TP or QP." The second axis single pattern to double pattern threshold can be the point in scaling along the second axis at which further scaling necessitates (or is dictated by a rule as requiring) a migration from a second axis single pattern lithography to a second axis double pattern lithography. The migration from the second axis single pattern lithography to the second axis double pattern lithography, associated with second axis single pattern to double pattern threshold, is labeled in FIG. 3 as "MY/SP-to-DP." The second axis double pattern to triple or quadruple pattern threshold can be the point in scaling along the second axis, assuming a second axis double pattern lithography, at which further scaling necessitates (or is dictated by a rule as requiring) a migration from the second axis double pattern lithography to a second axis triple or quadruple pattern lithography. The migration from the second axis double pattern lithography to the second axis triple or quadruple pattern lithography is labeled in FIG. 3 as "MY/DP-to-TP or QP."

Figure 4:
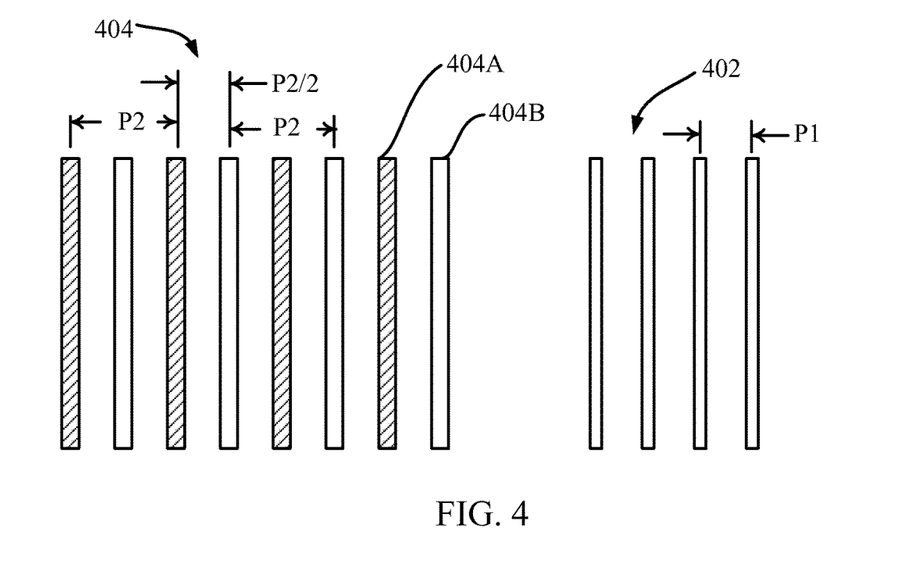
FIG. 4 shows pitch and alignment in one example of single patterning and double patterning.

FIG. 4 shows pitch and alignment in one example of single patterning and double patterning. Referring to FIG. 4, a single pattern configuration 402 can have a pitch P1.

Features according to the single pattern configuration 402 can be exposed on a semiconductor surface (not visible in FIG. 4), by a single lithographic mask (not visible in FIG. 4). One example double pattern configuration 404 can comprise a base pattern 404A (marked in hash lines) having pitch P2, and an offset or second pattern 404B, having the same pitch P2 but offset in the pitch direction from the base pattern 404A by one-half the pitch P2. The combination of 404A and 404B can provide the double pattern configuration 404 with an effective pitch of one half P2, or P2/2. Conventional techniques for forming the offset or second pattern 404B are known to persons of ordinary skill and, therefore, further detailed description is omitted.

Figure 5:
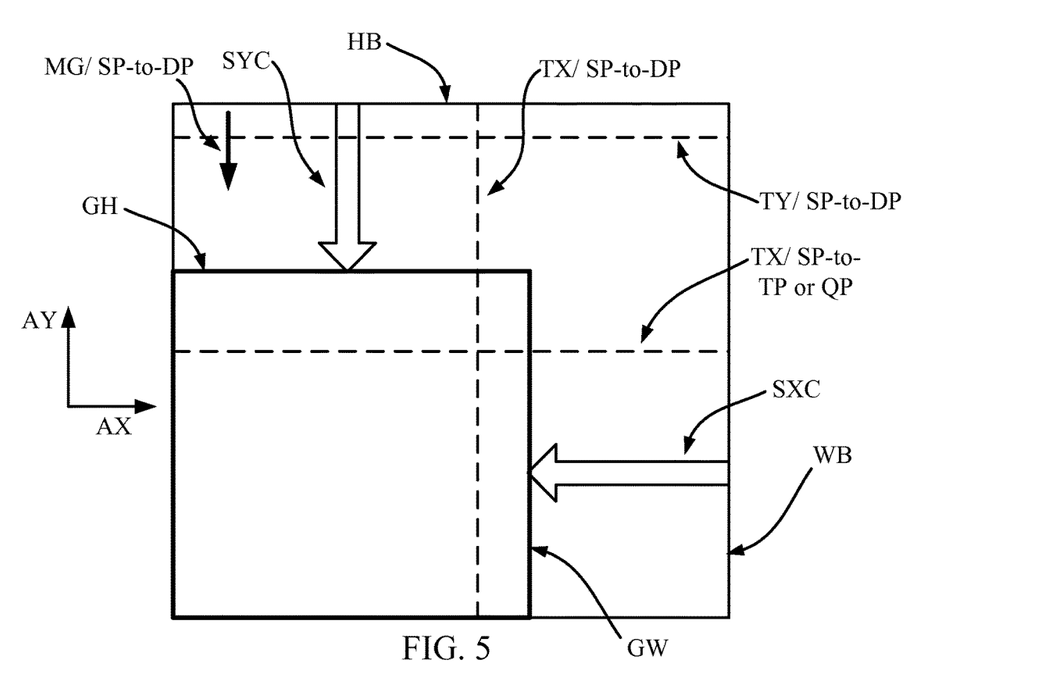
FIG. 5 shows a conventional technique geometric scaling result, relative to complexity inflection points as diagrammed by FIG. 3.

FIG. 5 shows a conventional technique geometric scaling, using an example scaling factor of 0.7, mapped on the FIG. 3 diagram of complexity inflection points. Referring to FIG. 5, conventional technique geometric scaling can comprise applying conventional first axis scaling, labeled "SXC," along the first axis (i.e., the axis labeled "AX"), and conventional second axis scaling, labeled "SYC," along the second axis (i.e., the axis labeled "AY"). The conventional first axis scaling starts at the starting width boundary (labeled "WB" as in FIG. 3), and continues along the first axis until reaching a conventional scaled width boundary, labeled "GW." The conventional scaled width boundary is shown at a position that provides a scaled width that is 0.7 time the starting width. Referring to FIG. 5, it can be seen that the conventional first axis scaling stopped far short of reaching the first axis single pattern to double pattern threshold (labeled "TX/SP-to-DP" as on FIG. 3). The second axis scaling (labeled "SYC") can then be applied, starting at the starting height boundary (labeled "HB") and continuing until reaching a scaled height boundary (labeled "SHB"). The scaled height boundary for this example provided a scaled height that is the desired 0.7 times the starting height.

Referring to FIG. 5, the second axis scaling (labeled "SYC"), however, can have significantly higher complexity than the first axis scaling. One example of the higher complexity, which can be substantial even standing alone, is the necessity of crossing the second axis single pattern to double pattern threshold (labeled "TY/SP-to-DP") in order to reach the scaled height boundary that provides 0.7 times the starting height. Crossing the second axis single pattern to double pattern threshold, in turn, necessitates applying the second axis single pattern lithography to second axis double pattern lithography migration. Another example of the higher complexity during the second axis scaling can be the differences, which can be significant, in spacing, routing and re-routing issues between first axis scaling (i.e., in the CPP direction) and second axis scaling (i.e., in the MT direction). Additional to and exacerbating the spacing, routing and re-routing issues can be the potential for conventional technique geometric scaling to prevent spaces between features in one axis from becoming available for re-routing in the process of scaling the other axis.

In methods according to various aspects, an asymmetric scaling process can be applied. As will understood from this disclosure, example asymmetric scaling processes according to various aspects can obtain area improvement comparable to conventional geometric scaling, while providing additional technical solutions including, for example, but not limited to, lower complexity. Further technical solutions can be provided by scaling, according to disclosed aspects, substantially more along one of the first axis and second axis than the other. Scaling more along one of the first axis and second axis than the other can provide, as described in further detail in later sections, options and other assistance in performing the more substantial of the first axis and second axis scaling. In an aspect, such avenues, options and other assistance can be provided by relative widening of spaces along the lesser scaled axis obtained through asymmetry in scaling.

In an aspect, in one method for asymmetric scaling an integrated circuit operations can include receiving a circuit layout data, wherein the circuit layout data includes a present value of a first axis pitch, and a present value of a second axis pitch. In an aspect, the first axis pitch is parallel to a first axis, the second axis pitch is parallel to a second axis, and the first axis is traverse to the second axis. Referring to FIGS. 1 and 3, one example first axis pitch may be the contact poly pitch (labeled "CPP" in FIG. 1), and one example second axis pitch may be the metallization pitch (labeled "MT" in FIG. 1). Referring to FIG. 1, one example first axis may be the axis labeled "AX," and one example second axis may be the axis labeled "AY."

In an aspect, in one method for asymmetric scaling an integrated circuit, operations can include receiving a first axis pitch threshold and a second axis pitch threshold, wherein the first axis pitch threshold represents a lower limit of the first axis pitch that, if crossed, requires migrating to a higher resolution first axis lithography, and the second axis pitch threshold represents a lower limit of the second axis pitch that, if crossed, requires migrating to a higher resolution second axis lithography. Referring to FIG. 3, one example first axis pitch threshold may the first axis single pattern-to-double pattern threshold, labeled "TX/SP-to-DP" and one example second axis pitch threshold may be the second axis single pattern to double pattern threshold, labeled "TY/SP-to-DP." In an aspect, in one method for asymmetric scaling an integrated circuit, operations can also include, upon a difference between the present value of the first axis pitch and the first axis pitch threshold being larger than a difference between the present value of the second axis pitch and the second axis pitch threshold, scaling the first axis pitch, wherein scaling the first axis pitch includes scaling the first axis pitch toward the first axis pitch threshold. Referring to FIG. 3, one example meeting this condition can be the difference between the starting width boundary that is labeled "WB" and the first axis single pattern to double pattern threshold that is labeled "TX/SP-to-DP" being greater than the difference between the starting height boundary that is labeled "HB" and the second axis single pattern to double pattern threshold that is labeled "TY/SP-to-DP."

In an aspect, the first axis margin and the second axis margin may be determined based on the present resolution limits of the first axis lithography and the second axis lithography. For example, the first axis margin may be a difference between the present value of the first axis pitch and a first axis resolution limit, and the second axis margin may be a difference between the present value of the second axis pitch and a second axis resolution limit. Referring to FIG. 3, as one example, the first axis single pattern-to-double pattern threshold that is labeled "TX/SP-to-DP" can be set at a given resolution limit of a given first axis lithography, i.e., the first axis resolution limit. Likewise, referring still to FIG. 3, the second axis single pattern-to-double pattern threshold that is labeled "TY/SP-to-DP" can be set at a given resolution limit of a given second axis lithography, i.e., the second axis resolution limit. In an aspect, operations can also include, upon the first axis margin being larger than the second axis margin, scaling the first axis pitch, wherein scaling the first axis pitch scales the first axis pitch toward the first axis resolution limit.

Figure 6:
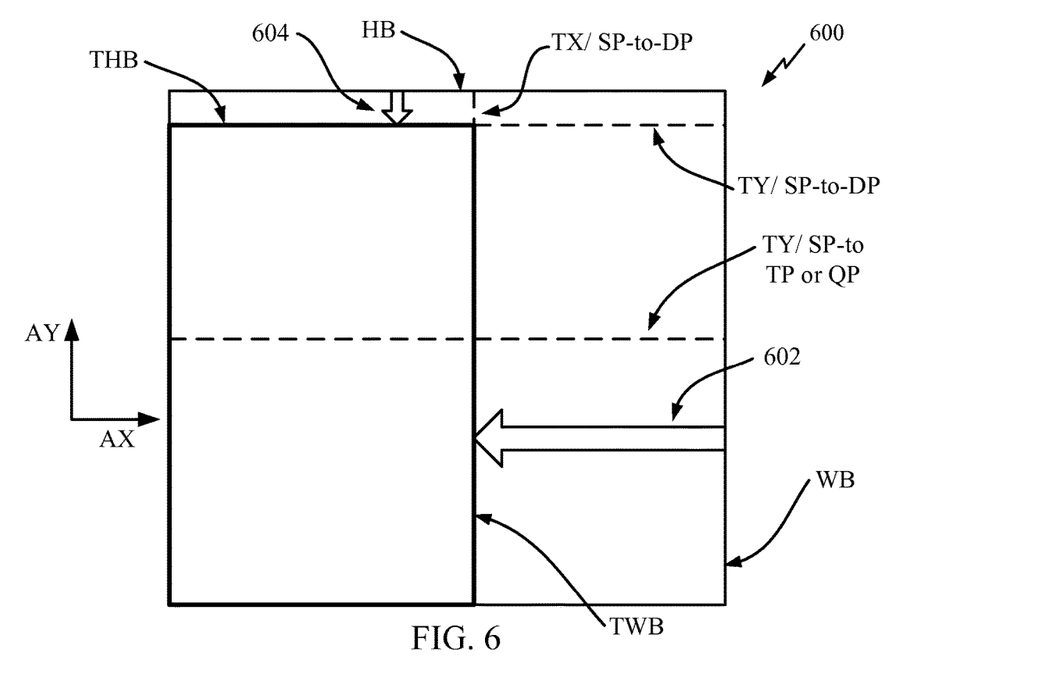
FIG. 6 shows an example result in an example asymmetric scaling process according to one exemplary aspect, relative to complexity inflection points as diagrammed by FIG. 3.

FIG. 6 is a diagram 600 of an example asymmetric first axis and second axis scaling according to one exemplary aspect, in relation to complexity inflection points diagrammed by FIG. 3. Referring to FIG. 6 and assuming CPP is the first axis pitch, the single pattern to double pattern threshold that is labeled "TX/SP-to-DP" can be an example of a first axis resolution limit of a single pattern lithography. Accordingly, the difference between the starting width boundary and the single pattern to double pattern threshold that is labeled "TX/SP-to-DP" can be one example first axis margin. For convenient reference to FIG. 6 in describing further operations, its example first axis margin will be referred to as "the FIG. 6 first axis margin" (a labeled not appearing separately in FIG. 6).

As also described above, operations can include receiving or determining a second axis margin, which can be a difference between the present value of the second axis pitch and a second axis resolution limit of a single pattern lithography. Assuming MT is the second axis pitch, the starting height boundary of the pre-scaled standard cell area 302 can correspond (e.g., number of rails multiplied by MT) to a present value of that MT. The second axis single pattern to double pattern threshold that is labeled "TY/SP-to-DP" can be an example of a second axis resolution limit of a single pattern lithography. Accordingly, the difference between the FIG. 3 starting height boundary that is labeled "HB" and the second axis single pattern to double pattern threshold that is labeled "TY/SP-to-DP" can be one example second axis margin. For convenient reference to FIG. 6 in describing further operations, its example second axis margin will be referred to as "the FIG. 6 second axis margin" (a label not appearing separately in FIG. 6).

Continuing to refer to FIG. 6, operations in one asymmetric scaling process can depend, at least in part, upon which of the FIG. 6 first axis margin and the FIG. 6 second axis margin is larger. For example, in an aspect, upon the FIG. 6 first axis margin being larger than the FIG. 6 second axis margin, operations can include a first axis scaling 602, which can scale the first axis pitch to the first axis resolution limit of a single pattern lithography, i.e., to the first axis single pattern-to-double pattern threshold that is labeled "TX/SP-to-DP."

Referring to FIG. 6, in an aspect, upon scaling the first axis pitch to the resolution limit of a single pattern lithography, a second axis scaling 604 can be applied. In an aspect, both the first axis scaling and the second axis scaling can be constrained to single pattern lithography. This can be referred to as a "single pattern limited scaling." In one aspect, the second-performed scaling, which in the FIG. 6 example is the second axis scaling, can stop prior to reaching the resolution limit of the second axis single pattern lithography. The stopping point can be referred to as an intermediate" scaling value. In another aspect, the second-performed scaling can push all the way to the resolution limit of single pattern lithography along its axis. Referring to FIG. 6, the second axis scaling 604 is shown as an example, as it pushes the second axis scaling all the way to the second axis single pattern resolution limit, e.g., the second axis single pattern to double pattern threshold that is labeled "TY/SP-to-DP." Asymmetric scaling as described above in reference to FIG. 6 will hereinafter be referred to as "single pattern asymmetric scaling." It will be understood that this name—"single pattern asymmetric scaling"—has no inherent meaning, and all instances thereof in this disclosure can be replaced with another uniform term with no change in the subject matter that is disclosed.

Referring to FIG. 6, the example operations in the single pattern asymmetric scaling described above did not require migrating the first axis lithography or the second axis lithography to a double pattern or higher, yet can obtain an area reduction just slightly less than that provided by conventional geometric technique double pattern etching, at far lower costs. Aspects that can provide such area reduction can include, as described above, asymmetrically pushing the scaling along the axis in which the present un-scaled standard cell has the greatest margin, by utilizing space along the lesser scaled axis that the asymmetric scaling itself makes available. In addition, the other axis can then be scale, for example, all the way to the single pattern lithography resolution limit along that axis.

In a further aspect, it may be predetermined that a first axis scaling or a second axis scaling can exceed the resolution limit of the single pattern lithography along that axis. In other words, the cost of a migration from a single pattern to a double pattern lithography along the first axis, or the second axis, or both, may be deemed acceptable. In an aspect, an asymmetric scaling according to the disclosed concepts can pre-assign, for example, the resolution limit of the first axis double pattern lithography or the second axis double pattern lithography as the operative complexity inflection point. Assume, for example, that it is predetermined that the second axis lithography will be migrated to a double pattern lithography. Scaling may continue along the first axis and stop at a point, for example, at which any further scaling may require migrating from the first axis double pattern lithography to a first axis triple pattern or quadruple pattern lithography. That point could be another example of a complexity inflection point.

Example operations in exemplary asymmetric scaling processes according to other aspects can include, and exploit, a predetermined migration along the first axis or the second axis, from single pattern to double pattern lithography. In one aspect, the scaling capability made available from the single to double patterning migration may be more fully utilized than in conventional geometric scaling. In an aspect, operations can include predetermining one of the first axis and second axis for migration to double patterning then, either while or sequentially to a moderate scaling along the non-selected axis, pushing the scaling along the selected axis, past the single to double patterning threshold, then continuing that scaling until reaching the minimum resolution attainable with the double patterning. For purposes of description, processes according to these asymmetric aspects can be referred to as "asymmetric, full utilization double pattern scaling." It will be understood that this name—"asymmetric, full utilization double pattern scaling"—has no inherent meaning, and all instances thereof in this disclosure can be replaced with another uniform term with no change in the subject matter that is disclosed.

Figure 7:
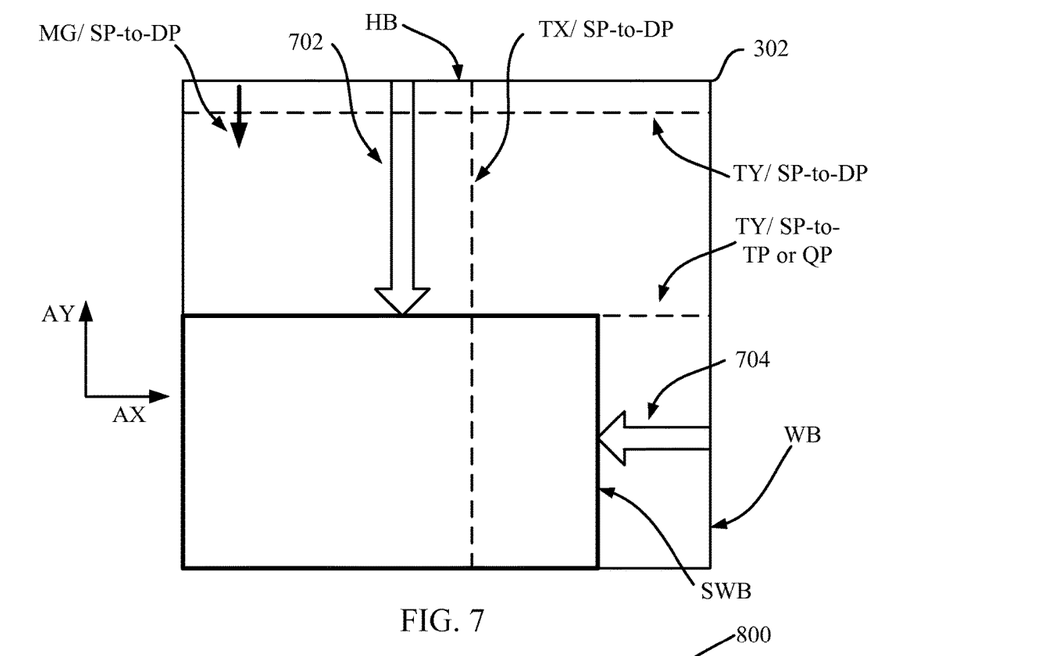
FIG. 7 shows an example result in an example asymmetric scaling process according to another exemplary aspect, relative to complexity inflection points as diagrammed by FIG. 3.

Operations further to asymmetric, full utilization double pattern scaling processes according to disclosed aspects will be described in reference to FIG. 7. Referring to FIG. 7, operations in, or in parts of asymmetric, full utilization double pattern scaling processes according to one aspect can include receiving a circuit layout data, which can include a starting or present value of a first axis pitch and a starting or present value of a second axis pitch. One example first axis pitch can be the FIG. 1 CPP along the first axis. One example second axis pitch can be the FIG. 1 metallization pitch labeled "MT." An example according to one aspect will be described assuming a migration of the second axis lithography to a double pattern lithography has already been chosen. Accordingly, referring to FIG. 7, the second axis double pattern to triple or quadruple pattern threshold, labeled "TY/DP-to-TP or QP," can be used to determine the second axis margin. Also, the FIG. 7 example shows the second axis margin larger than the first axis margin. In other words, the distance or difference between the starting or present value of the second axis pitch (corresponding to the starting height boundary labeled "HB") and the second axis double pattern to triple or quadruple pattern threshold (labeled "TY/DP-to-TP or QP") is greater than the difference between the starting or present value of the first axis pitch (corresponding to the starting width boundary labeled "WB") and the first axis single pattern to double pattern threshold.

Referring to FIG. 7, in an aspect, operation of asymmetric, full utilization double pattern scaling processes can first apply a second axis scaling 702 that scales the second axis pitch, e.g., MT, from its present value, down to and past the second axis single pattern-to-double pattern threshold that is labeled "TY/SP-to-DP," then continues, aggressively, and pushes the second axis pitch all the way to the resolution limit of the second axis double pattern lithography. In other words, the second axis scaling 702 can push the second axis pitch, from its starting value, all the way to the second axis double pattern to triple or quadruple pattern threshold labeled "TY/DP-to-TP or QP." Comparing the second axis scaling 702 to the FIG. 5 second axis scaling SYC which is within a conventional geometric scaling, shows stark contrast. More specifically, the second axis scaling SYC stops at about ⅔ of a full available scaling after the second axis migrated to double pattern lithography. As described above, the minimum obtainable value of the second axis pitch may be at, or close to one-half of the DA value resulting from plugging known lithography process parameters into well-known resolution equations. In an aspect, operations in scaling the first axis double pattern pitch all the way to the second axis double pattern resolution limit can utilize routing spaces parallel to the first axis pitch, as described above in reference to FIG. 6.

Referring to FIG. 7, in aspect, after the second axis scaling 702 a first axis scaling 704 may be applied. The first axis scaling may push the first axis pitch from its starting or present value (corresponding to the width boundary labeled "WB") to a first axis intermediate value, corresponding to the FIG. 7 example scaled width boundary, which is labeled "SWB."

Figure 8:
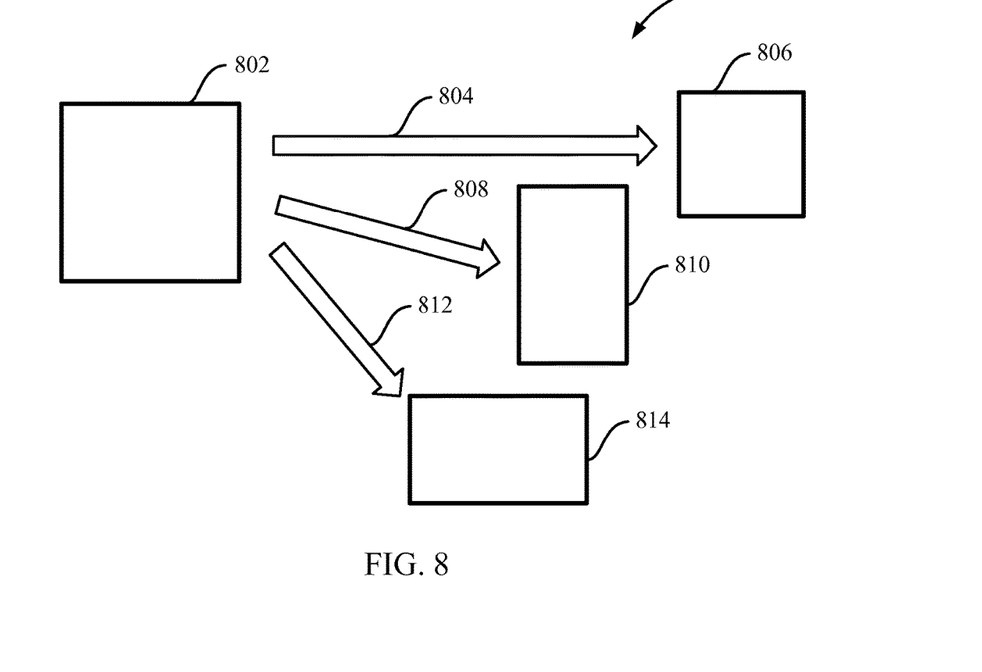
FIG. 8 is a diagram of respective aspect ratio and area reduction provided by conventional technique geometric scaling, and as provided by an example asymmetric scaling processing according to one exemplary aspect, and as provided by an example asymmetric scaling process according to another example aspect.

FIG. 8 is a graphical representation 800 of respective aspect ratio and area reduction provided by conventional technique geometric scaling, and as provided by an example asymmetric scaling processing according to one exemplary aspect, and as provided by an example asymmetric scaling process according to another example aspect.

Referring to FIG. 8, a current or un-scaled standard cell area 802 may be scaled through conventional geometric scaling techniques 804, to obtain a symmetric scaled standard cell 806. As described above, one example R can be 0.7, which will obtain a symmetric scaled standard cell 806 having an area approximately one-half the area of the un-scaled standard cell area 802. However, as discussed in reference to FIG. 5, costs of conventional geometric scaling techniques 804 can include the complexity of double patterning lithography, added to the complexity of routing and re-rerouting in the scaling.

Continuing to refer to FIG. 8, in methods according to exemplary aspects, the current or un-scaled standard cell area 802 may be scaled through single pattern asymmetric scaling 808 to obtain a first asymmetric scaled standard cell 810. Operations in the single pattern asymmetric scaling 808 can be as described in reference to FIG. 6. Example area reductions obtained by the first asymmetric scaled standard cell 810 can include 0.5 to 0.6, as described in reference to FIG. 6. Although the 0.6 end of the area reduction range may be not quite the 0.5 example reduction obtained by the FIG. 5 conventional geometric scaling, additional and different technical solutions. Examples can include ease of routing and re-routing space provided by the less-scaled axis and, since all lithography is single pattern, no additional fabrication expenses of double or higher patterning.

Referring to FIG. 8, in another aspect, the current or un-scaled standard cell area 802 may be scaled through a asymmetric, full utilization double pattern scaling process 812 according to aspects disclosed herein, to obtain a second asymmetric scaled standard cell 814. Operations in the asymmetric, full utilization double pattern scaling process 812 can be, for example, according examples described in reference to FIG. 7. As also described above asymmetric, full utilization double pattern scaling processes according to various disclosed aspects can provide area reductions that include, but are not limited to 0.5 to 0.6. The area reductions that can be obtained through the full utilization double pattern scaling process 812 can, at the 0.6 end of the range, be slightly less than the 0.5 example shown obtained by the FIG. 5 conventional geometric scaling technique. Examples of the full utilization double pattern scaling process 812 can include migration, generally in one axis, to double pattern lithography, and can therefore incur costs of such migration. However, the full utilization double pattern scaling process 812 can significant additional, different technical solutions, for example, to routing and re-routing problems that be inherent in conventional geometric scaling techniques. One such technical solution can be routing and re-routing space provided by the less-scaled axis and, since all lithography is single pattern, no additional fabrication expenses of double or higher patterning.

Figure 9:
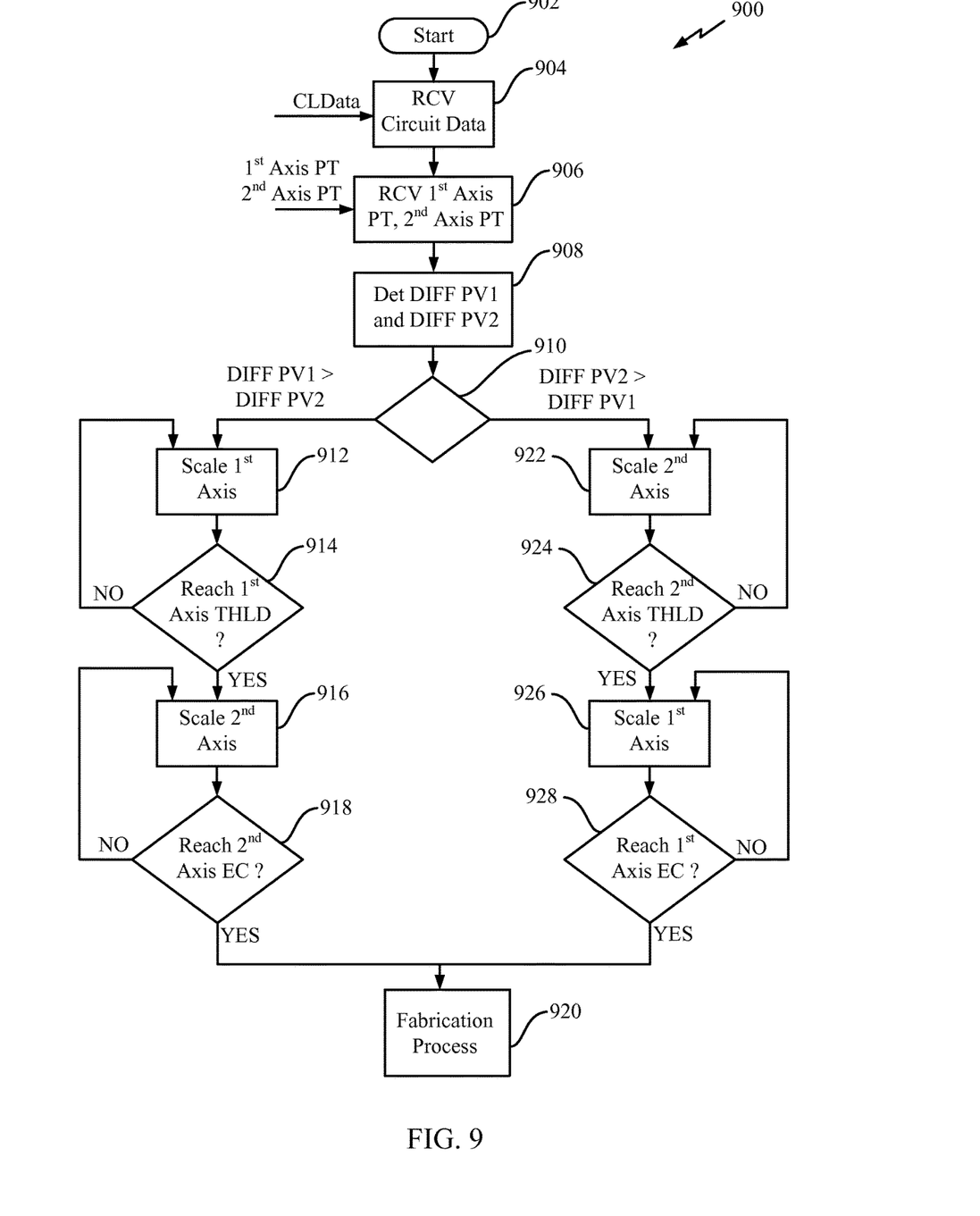
FIG. 9 shows a high level logic flow of example operations in part of one asymmetric scaling process according to one example aspect.

FIG. 9 shows one flow 900 of example operations within one single pattern constrained asymmetric scaling process according to various aspects. Operations in the flow 900, for example, can include operations as described in reference to FIG. 6. Referring to FIG. 9, operation in the flow 900 can begin at an arbitrary start at 902, and then proceed to 904 to receive a circuit layout data CLData. The CLData can include a present value of a first axis pitch (e.g., the FIG. 1 "CPP") and a present value of a second axis pitch (e.g., the FIG. 1 "MT"). The first axis pitch can be parallel to a first axis (e.g., the "AX" axis of FIGS. 1, 3 and 6), the second axis pitch can be parallel to a second axis (e.g., the "AY" axis of FIGS. 1, 3 and 6), and the first axis traverse to the second axis.

Operations in the flow 900 can then proceed to 906 and receive (e.g., retrieve from storage, or receive by user input) a first axis pitch threshold and a second axis pitch threshold, labeled on FIG. 9 as "$1^{st}$ Axis PT" and "$2^{nd}$ Axis PT," respectively. In an aspect, flow 900 may assume a single pattern lithography constraint, in both the first axis and the second axis. Therefore, in operations according to this aspect, the present value of the first axis pitch corresponds to a first axis single pattern lithography, and the present value of the second axis pitch corresponds to a second axis single pattern lithography. According to this aspect, one example first axis pitch threshold may be the first axis single pattern to double pattern threshold that is labeled on FIGS. 3 and 6 as "TX/SP-to-DP." Likewise, one example second axis pitch threshold may be the second axis single pattern to double pattern threshold that is labeled "TY/SP-to-DP." In another aspect, the flow 900 may assume that migration to a double pattern lithography is preselected, for example, for the second axis. According to this aspect, one example second axis pitch threshold may be the second axis double pattern to triple or quadruple pattern threshold that is labeled on FIGS. 3 and 7 as "TY/DP-to-TP or QP."

After operations at 906, the flow 900 can then proceed to 908 to determine the first axis margin and the second axis margin. As described above, the first axis margin can be the difference between the present value of the first axis pitch and the first axis pitch threshold. This difference, i.e., the first axis margin, is labeled on FIG. 9 as "DIFF PV1." Also as described above, the second axis margin can be the difference between the present value of the second axis pitch and the second axis pitch threshold, and is labeled on FIG. 9 as "DIFF PV2." It will be understood that "DIFF PV1" and "DIFF PV2" are arbitrary abbreviations used for convenience, and have no inherent meaning. Operations in the flow 900 can then proceed to the conditional branch at 910 and compare or otherwise determine the larger among the first axis margin and the second axis margin. Such operations are labeled on FIG. 9 as "COMP DIFF PV1 to DIFF PV2." Upon DIFF PV1 being larger, the flow 900 can proceed to 912 and apply a first axis scaling of the first axis pitch toward the first axis pitch threshold. FIG. 6 shows one example meeting the condition of the first axis margin being larger than the second axis margin this condition, and also shows the first axis scaling 602 as one example of operations at 912.

Continuing to refer to FIG. 9, operations at 912 of the first axis scaling may continue until the first axis pitch reaches the first axis pitch threshold, which is shown as the escape condition block 914. Referring to FIG. 6, one example of operations at 912 and 914 can be the first axis scaling 602 continuing until reaching the first axis single pattern to double pattern threshold that is labeled "TX/SP-to-DP." Referring to FIG. 9, after the operations at 912 and 914, operations in the flow 900 may proceed to 916 and scale the second axis pitch toward the second axis pitch threshold. In an aspect operation at 916 of the second axis scaling may continue until the second axis pitch reaches an escape condition at block 918. One example escape condition can be reaching the second axis single pattern to double pattern threshold that is labeled "TY/SP-to-DP." In an aspect, upon completion of operations at 916 and 918, the flow 900 may proceed to 920 and perform operations of a circuit fabrication process. Operations at 920 can include first axis single pattern lithography processes, which can include exposing features spaced apart, parallel to the first axis, by the first axis resolution limit. Operations at 920 can also include second axis single pattern lithography processes, which can include exposing features spaced apart, parallel to the second axis, by the second axis resolution limit.

Above-described example operations in the flow 900 assumed DIFF PV1 being larger. Referring to FIG. 9 at 910, in operations according to another aspect, DIFF PV2 may be larger than DIFF PV1. For example, referring to FIG. 7, in an aspect the second axis pitch threshold may be the second axis double pattern to triple or quadruple pattern threshold that is labeled "TY/DP-TP or QP." DIFF PV2 is therefore larger than DIFF PV1 because the difference (or distance) from the height boundary that is labeled "HB" to the second axis double pattern to triple or quadruple pattern threshold that is labeled "TY/DP-TP or QP" is greater than the difference (or distance) from the width boundary that is labeled "WB" to the first axis single pattern to double pattern threshold that is labeled "TX/SP-to-DP." In an aspect, the flow 900 can then proceed to 922 and apply a second axis scaling of the second axis pitch toward the second axis pitch threshold, and may continue until the second axis pitch reaches the second axis pitch threshold, which is shown as the escape condition block 924. Referring to FIG. 7, one example of operations at 922 and 924 can be the second axis scaling 702, pushing the second axis pitch to the second axis single pattern to double pattern threshold that is labeled "TY/SP-to-DP," and then continuing to push the second axis pitch all the way to the second axis double pattern to triple or quadruple pattern threshold that is labeled "TY/DP-TP or QP."

Referring to FIG. 9, after the operations at 922 and 924, operations in the flow 900 may proceed to 926 and scale the first axis pitch toward the first axis pitch threshold. In an aspect, operations at 926 may terminate at a given escape condition at 928. In one aspect, the given escape condition at 928 may be an intermediate scaling value, which may be prior to the first axis resolution limit. Referring to FIG. 7, one example of operations at 926 and 928 can be the first axis scaling 704, pushing the first axis pitch to a scaled first axis pitch, corresponding to the scaled width boundary that is labeled "SWB." In an aspect, upon completion of operations at 926 and 928, the flow 900 may proceed to operations at 920 in a circuit fabrication process, as described above.

Figure 10:
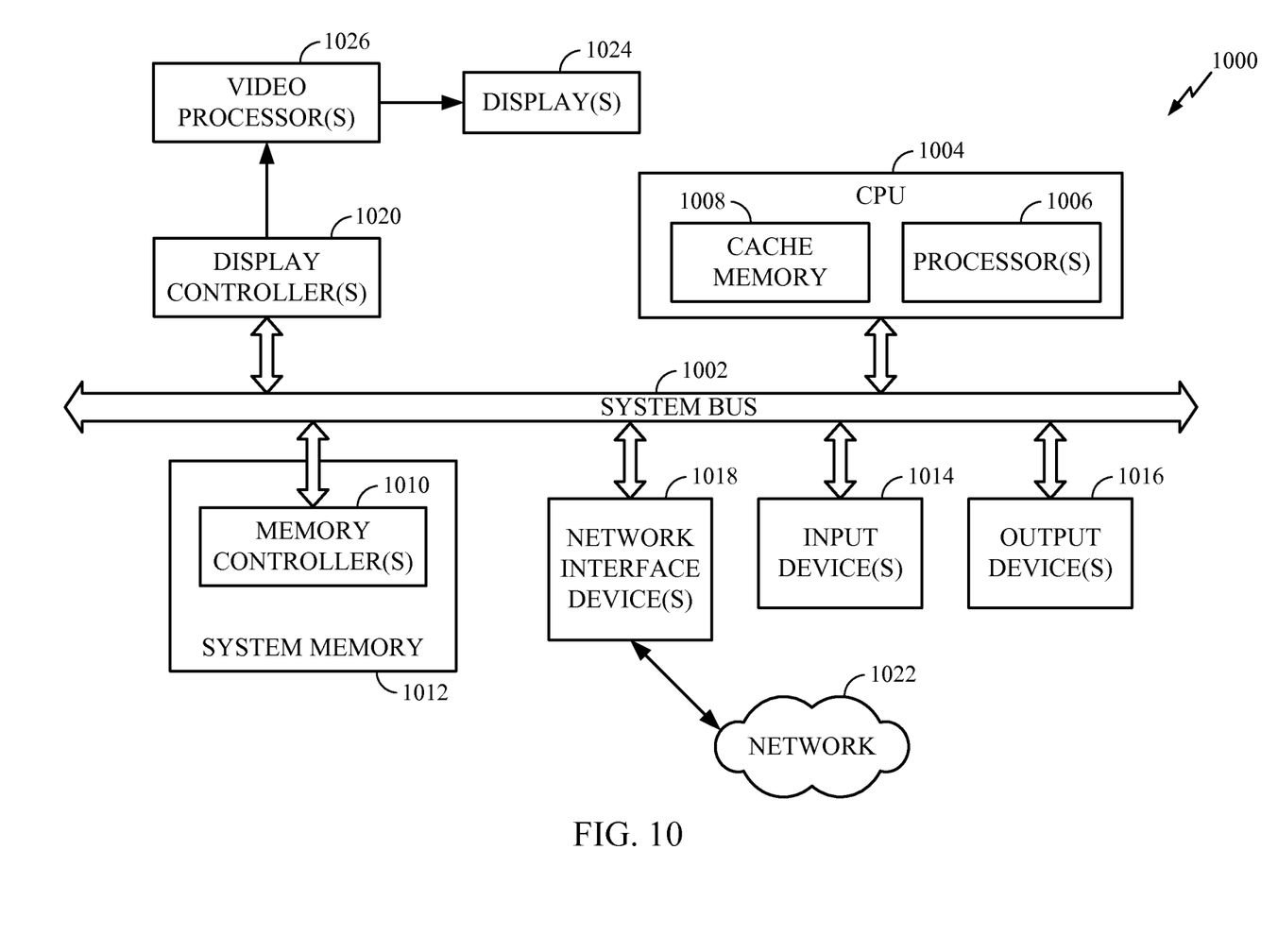
FIG. 10 shows a functional schematic of one example personal communication and computing device in accordance with one or more exemplary aspects.

FIG. 10 illustrates one example of a personal communication and computing device 1000 that can be configured, as described herein, to utilize an asymmetric scaling as described in reference to the FIGS. 6, 7 and 9. Referring to FIG. 10, the personal communication and computing device 1000 can include a system bus 1002 and, coupled to the system bus 1002, one or more CPUs 1004. The CPUs 1004 may comprise, for example, one or more processors or CPUs 1006 and one or more cache memories 1008. The CPU(s) 1006 may be implemented by, for example, one or more programmable computing devices such as, without limitation, one or more ARM-type processing devices (not separately visible in FIG. 10). The CPUs 1004 may, according to conventional communication protocols, communicate with these other devices by exchanging address, control, and data information over the system bus 1002.

Referring to FIG. 10, the CPU(s) 1004 may communicate bus transaction requests to a memory controller 1010 of a memory system 1012 as one example of a slave device.

Referring to FIG. 10, examples of other master and slave devices can include one or more input devices 1014, one or more output devices 1016, one or more network interface devices 1018, and one or more display controllers 1020. The input devices(s) 1014, if employed, can include any type of input device, including but not limited to input keys, switches, voice processors, and the like. The output device (s) 1016, if used, can include any type of output device, including but not limited to audio, video, other visual indicators and the like. The network interface device(s) 1018, if used, can be any type of network interface device configured to allow exchange of data to and from a network 1022. The network 1022 can be any type of network, including but not limited to a wired or wireless network, a private or public network, a local area network (LAN), a wide area network (WLAN) and the Internet.

Continuing to refer to FIG. 10, the CPU(s) 1004 may also be configured to access the display controller(s) 1020 over the system bus 1002 to control information sent to one or more displays 1024. The display controller(s) 1020 may send information to the display(s) 1024 to be displayed, for example, via one or more video processors 1026. Display(s) 1024, if used, can include any type of display, for example, an active or passive liquid crystal display (LCD), a plasma display, and cathode ray tube (CRT Various aspects are described, or additionally described hereinabove through example operations. It will be understood that except where otherwise described such operations can be performed by specific circuits (e.g., application specific integrated circuits (ASICs)), by program instructions being executed by one or more processors, or by a combination of both. In addition, specific circuits (e.g., ASICs), processors and program instructions executed by one or more of the same may be described as "logic configured to" perform described operations and action(s). Additionally, sequences of actions described herein can be considered to be embodied entirely within any form of computer readable storage medium having stored therein a corresponding set of computer instructions that upon execution would cause an associated processor to perform the functionality described herein. Thus, various aspects may be embodied in a number of different forms, all of which are contemplated to be within the scope of the claimed subject matter.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for scaling an integrated circuit, comprising:
receiving a circuit layout data, wherein the circuit layout data includes a present value of a first axis pitch and a present value of a second axis pitch, wherein the first axis pitch is parallel to a first axis, wherein the second axis pitch is parallel to a second axis, wherein the first axis is traverse to the second axis; and
upon a first axis margin being larger than a second axis margin, scaling the first axis pitch, wherein scaling the first axis pitch scales the first axis pitch toward a first axis resolution limit, and
upon the second axis margin being larger than the first axis margin, scaling the second axis pitch, wherein scaling the second axis pitch includes scaling the second axis pitch toward a second axis resolution limit;
wherein the first axis margin is a difference between the present value of the first axis pitch and the first axis resolution limit, wherein the first axis resolution limit is a given resolution limit of a given first axis lithography, and
wherein the second axis margin is a difference between the present value of the second axis pitch and the second axis resolution limit, wherein the second axis resolution limit is a given resolution limit of a given second axis lithography.

2. The method of claim 1, wherein the first axis pitch is a contact poly pitch and the second axis pitch is a metallization pitch.

3. The method of claim 1, wherein scaling the first axis pitch further includes scaling the first axis pitch to the first axis resolution limit.

4. The method of claim 3, further comprising:
upon scaling the first axis pitch to the first axis resolution limit, scaling the second axis pitch to the second axis resolution limit.

5. The method of claim 4, wherein the given first axis lithography is a first axis single pattern lithography, and wherein the given second axis lithography is a second axis single pattern lithography.

6. The method of claim 5, wherein the first axis pitch is a contact poly pitch and the second axis pitch is a metallization pitch.

7. The method of claim 3, wherein the given second axis lithography is a second axis double pattern lithography, and the second axis resolution limit is a resolution limit of the second axis double pattern lithography.

8. The method of claim 7, wherein the first axis pitch is a contact poly pitch and the second axis pitch is a metallization pitch.

9. The method of claim 7, wherein scaling the second axis pitch further includes scaling the second axis pitch to the second axis resolution limit.

10. The method of claim 9, wherein scaling the second axis pitch includes scaling the second axis pitch during a maintaining of the first axis pitch at the present value of the first axis pitch, and wherein scaling the second axis pitch is configured to form routing spaces parallel to the first axis, and to utilize the formed routing spaces.

11. The method of claim 9, wherein the first axis pitch is a contact poly pitch and the second axis pitch is a metallization pitch, and wherein the method further comprises:
upon scaling the second axis pitch to the second axis resolution limit,
performing a circuit fabrication process, wherein the circuit fabrication process includes the second axis double pattern lithography.

12. The method of claim 9, further comprising:
upon scaling the second axis pitch to the second axis resolution limit, scaling the first axis pitch, wherein scaling the first axis pitch includes scaling the first axis pitch to an intermediate scaling value, wherein the intermediate scaling value is less than the present value of the first axis pitch and greater than the first axis resolution limit.

13. The method of claim 1, further comprising performing a fabrication process including a lithography process for at least one of the first axis or the second axis.

14. A computer product having a computer readable medium comprising instructions that, when read and executed by a processor, cause the processor to:

receive a circuit layout data, wherein the circuit layout data includes present value of a first axis pitch, and a present value of a second axis pitch, wherein the first axis pitch is parallel to a first axis, wherein the second axis pitch is parallel to a second axis, wherein the first axis is traverse to the second axis; and upon a first axis margin being larger than a second axis margin, to scale the first axis pitch, wherein to scale the first axis pitch includes to scale the first axis pitch toward a first axis resolution limit, and upon the second axis margin being larger than the first axis margin, to scale the second axis pitch, wherein to scale the second axis pitch includes to scale the second axis pitch toward a second axis resolution limit;

wherein the first axis margin is a difference between the present value of the first axis pitch and the first axis resolution limit, wherein the first axis resolution limit is a given resolution limit, along the first axis, of a given first axis lithography, and wherein the second axis margin is a difference between the present value of the second axis pitch and the second axis resolution limit, wherein the second axis resolution limit is a given resolution limit, along the second axis, of a given second axis lithography.

15. A method for scaling an integrated circuit, comprising:

receiving a circuit layout data, wherein the circuit layout data includes a present value of a first axis pitch, and a present value of a second axis pitch, wherein the first axis pitch is parallel to a first axis, wherein the second axis pitch is parallel to a second axis, wherein the first axis is traverse to the second axis;

receiving a first axis pitch threshold and a second axis pitch threshold, wherein the first axis pitch threshold represents a lower limit of the first axis pitch that, if crossed, requires migrating to a higher resolution first axis lithography, and wherein the second axis pitch threshold represents a lower limit of the second axis pitch that, if crossed, requires migrating to a higher resolution second axis lithography;

upon a difference between the present value of the first axis pitch and the first axis pitch threshold being larger than a difference between the present value of the second axis pitch and the second axis pitch threshold, scaling the first axis pitch, wherein scaling the first axis pitch includes scaling the first axis pitch toward the first axis pitch threshold; and upon a difference between the present value of the second axis pitch and the second axis pitch threshold being larger than a difference between the present value of the first axis pitch and the first axis pitch threshold, scaling the second axis pitch, wherein scaling the second axis pitch includes scaling the second axis pitch toward the second axis pitch threshold.

16. The method of claim 15, wherein scaling the first axis pitch further includes scaling the first axis pitch to the first axis pitch threshold.

17. The method of claim 16, wherein the first axis pitch is a contact poly pitch and the second axis pitch is a metallization pitch.

18. The method of claim 15, further comprising:
upon scaling the first axis pitch to the first axis pitch threshold, scaling the second axis pitch to the second axis pitch threshold.

19. The method of claim 18, wherein the present value of the first axis pitch corresponds to a first axis single pattern lithography.

20. The method of claim 19, wherein the lower limit of the first axis pitch is a limit that, if crossed, requires migrating from the first axis single pattern lithography to a first axis double pattern lithography.

21. The method of claim 20, wherein the present value of the second axis pitch corresponds to a second axis single pattern lithography, and wherein the lower limit of the second axis pitch is a limit that, if crossed, requires migrating from the second axis single pattern lithography to a second axis double pattern lithography.

22. The method of claim 15, wherein scaling the second axis pitch further includes scaling the second axis pitch to the second axis pitch threshold.

23. The method of claim 22, further comprising:
upon scaling the second axis pitch to the second axis pitch threshold, scaling the first axis pitch toward the first axis pitch threshold.

24. The method of claim 22, wherein the present value of the second axis pitch corresponds to a second axis single pattern lithography.

25. The method of claim 24, wherein the lower limit of the second axis pitch is a limit that, if crossed, requires migrating from the second axis single pattern lithography to a double pattern second axis lithography.

26. The method of claim 15, wherein the lower limit of the second axis pitch is a limit that, to reach, requires migrating from a second axis single pattern lithography to a second axis double pattern lithography and, if crossed, requires migrating from the second axis double pattern lithography to a second axis triple or quadruple pattern lithography.

27. The method of claim 26, wherein scaling the second axis pitch includes scaling the second axis pitch to the second axis pitch threshold.

28. The method of claim 15, further comprising performing a fabrication process including a lithography process for at least one of the first axis or the second axis.

29. A computer product having a computer readable medium comprising instructions that, when read and executed by a processor, cause the processor to:

receive a circuit layout data, wherein the circuit layout data includes a present value of a first axis pitch, and a present value of a second axis pitch, wherein the first axis pitch is parallel to a first axis, wherein the second axis pitch is parallel to a second axis, wherein the first axis is traverse to the second axis;

receive a first axis pitch threshold and a second axis pitch threshold, wherein the first axis pitch threshold represents a lower limit of the first axis pitch that, if crossed, requires migrating to a higher resolution first axis lithography, and wherein the second axis pitch threshold represents a lower limit of the second axis pitch that, if crossed, requires migrating to a higher resolution second axis lithography;

upon a difference between the present value of the first axis pitch and the first axis pitch threshold being larger than a difference between the present value of the second axis pitch and the second axis pitch threshold, to scale the first axis pitch, wherein scaling the first axis pitch includes scaling the first axis pitch toward the first axis pitch threshold; and upon a difference between the present value of the second axis pitch and the second axis pitch threshold being larger than a difference between the present value of the first axis pitch and the first axis pitch threshold, to scale the second axis pitch, wherein scaling the second axis pitch includes scaling the second axis pitch toward the second axis pitch threshold.

30. The computer product of claim 29, wherein the computer readable medium further comprises instructions that, when read and executed by the processor, cause the processor to include, in operations to scale the first axis pitch, scaling the first axis pitch to the first axis pitch threshold.

31. The computer product of claim 29, wherein the computer readable medium further comprises instructions that, when read and executed by the processor, cause the processor, upon scaling the first axis pitch to the first axis pitch threshold, to scale the second axis pitch to the second axis pitch threshold.

* * * * *